United States Patent
Nourrcier

[19]

[11] Patent Number: 5,847,655
[45] Date of Patent: Dec. 8, 1998

[54] SAFETY DISCHARGE CIRCUIT FOR HIGH VOLTAGE ELECTRICAL SYSTEM AND METHOD

[75] Inventor: Charles E. Nourrcier, Lakewood, Calif.

[73] Assignee: Raytheon Company, El Segundo, Calif.

[21] Appl. No.: 863,985

[22] Filed: May 27, 1997

[51] Int. Cl.⁶ .................................................. G08B 21/00
[52] U.S. Cl. ........................... 340/650; 340/649; 361/1; 307/140
[58] Field of Search .................................. 340/650, 649, 340/679, 680, 666; 361/1, 100; 307/135, 140; 324/509–511

[56] References Cited

U.S. PATENT DOCUMENTS

| | | | |
|---|---|---|---|
| 4,005,253 | 1/1977 | Walter | 174/37 |
| 4,199,072 | 4/1980 | Jacks | 220/3.4 |
| 4,207,558 | 6/1980 | Kunzer | 340/650 |
| 4,255,691 | 3/1981 | Inagaki et al. | 315/241 P |
| 4,774,390 | 9/1988 | Lehman et al. | 200/304 |
| 4,829,390 | 5/1989 | Simon | 340/650 |
| 4,914,854 | 4/1990 | Zhou et al. | 43/112 |
| 5,579,192 | 11/1996 | Lee | 361/18 |
| 5,641,953 | 6/1997 | Fisher, Jr. | 200/50.12 |

*Primary Examiner*—Thomas J. Mullen, Jr.
*Assistant Examiner*—Sihong Huang
*Attorney, Agent, or Firm*—Colin M. Raufer; Leonard A. Alkov; Glenn H. Lenzen, Jr.

[57] ABSTRACT

Safety discharge circuit and method, capable of protecting workers from electric shocks during maintenance of high voltage electrical systems. A high voltage electrical system is placed inside a grounded box having a cover, releasably connected to the box. The circuit uses an electronic device adapted to sense the removal of the cover from the box and disable the high voltage electrical system. The electronic device is connected to the cover at its input and to the high voltage electrical system at its output, and is preferably a semiconductor controlled rectifier having a gate at its input. The semiconductor controlled rectifier is in a reverse blocking state when the cover is connected to the box, and is latched in a forward conducting state when the cover is removed from the box. The connection from the gate of the semiconductor controlled rectifier to the cover is made through mounting screws, which hold the high voltage electrical system connected to the cover.

6 Claims, 1 Drawing Sheet

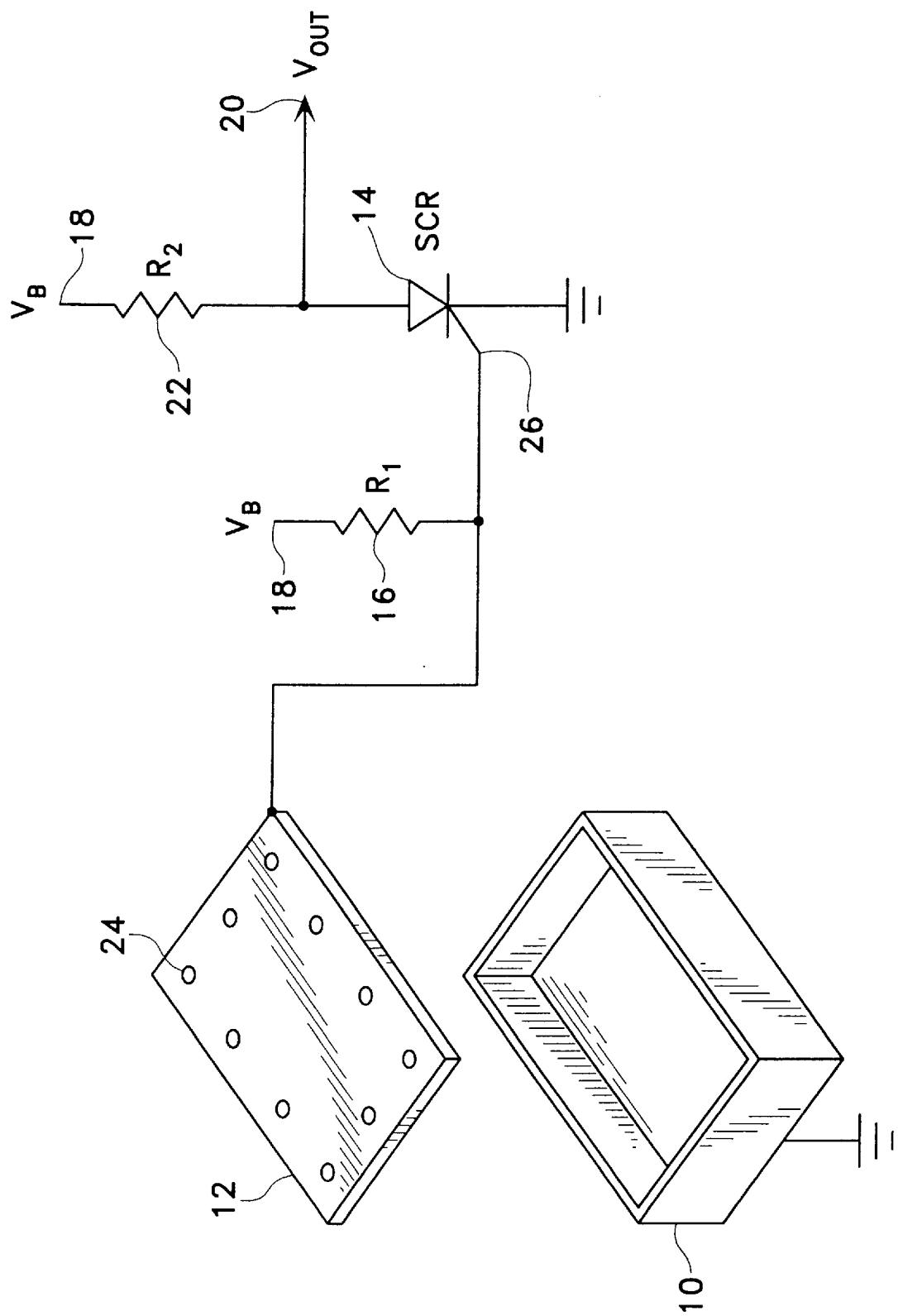

SAFETY DISCHARGE CIRCUIT FOR HIGH VOLTAGE ELECTRICAL SYSTEM AND METHOD

BACKGROUND OF THE INVENTION

1. Field of the Invention

This invention relates generally to a safety discharge circuit for high voltage electrical systems and method. More particularly, this invention relates to a method and a safety discharge circuit for electronically sensing the removal of the box cover and disabling the high voltage electrical system connected to the box.

2. Brief Description of the Prior Art

Conventionally, the safety of high voltage electrical systems during maintenance is provided by a mechanical solution using a blind-mate connector. The blind-mate connector is expensive to make and install and requires a high-reliability specially engineered wiring harness to complete the circuit. Furthermore, the blind-mate connector requires precise alignment of the box and cover during the attachment of the box cover and there is a risk of damaging the blind-mate connector.

SUMMARY OF THE INVENTION

The present invention contemplates a safety discharge circuit for a high voltage electrical system inside a box, wherein the removal of the box cover is sensed electronically, and the high voltage electrical system inside the box is instantaneously disabled, thus eliminating shock hazard during maintenance work. With the technique of the present invention, much more compact high voltage circuits are possible.

Two aspects of the present invention are a safety discharge circuit and method capable of protecting workers from electric shocks during maintenance of high voltage electrical systems.

The foregoing and additional features and advantages of this invention will become further apparent from the detailed description and accompanying drawing figures that follow. In the figures and written description, numerals indicate the various features of the invention, like numerals referring to like features, throughout for the drawing figures and the written description.

BRIEF DESCRIPTION OF THE DRAWINGS

FIG. 1 is an illustration of a schematic representing a safety discharge circuit for high voltage electrical systems, according to one embodiment of the present invention.

DETAILED DESCRIPTION OF THE INVENTION

FIG. 1 illustrates the basic concept of the present invention. It consists of a box 10 with a cover 12. The box 10 contains a high voltage electrical circuit, not shown, which requires occasional maintenance and is mechanically attached to an underside of said cover 12 and facing the inside of the box 10. The box 10 is grounded by being tied to a chassis ground, not shown. When the cover 12 is placed on the box 10, it comes into electrical contact with the box 10, and the cover 12 also becomes grounded. A control gate of a semiconductor controlled rectifier SCR 14 is electrically connected to the cover 12.

The semiconductor controlled rectifier SCR 14 is a four level device (pnpn), has three junctions, and three of its layers are connected to the outside electrodes. It is a member of the thyristor family, and is useful for switching states in circuits like relay controls, protective circuits and the like. SCRs can be built to control power in the megawatt region, to survive currents as high as 1500 A at 2000V, and to perform at frequencies as high as 50 kHz. The SCR 14 of the present invention is preferably a semiconductor controlled rectifier, but it can be any other kind of electronic device which can switch modes in response to a first input and stay latched until a second input is cycled off and back on. The SCR 14 has a forward conducting state and a reverse blocking state, and has for its control element a gate 26, which allows switching from the forward blocking to the forward conducting state, at a particular moment, which places the SCR 14 in a conductive, firing mode. This control is very rapid and requires very little energy.

The high voltage electrical system is controlled by the output 20 of the SCR 14, which is the SCR's 14 anode, its cathode being grounded independently of the cover 12. When the cover 12 is attached to the box 10, the gate 26 of the SCR 14 is effectively grounded through cover 12 and box 10, and there is a very small current at the output of the SCR 14, which has a very high impedance between its cathode and anode. The cover 12 is also connected to a resistor $R_1$ 16, tied at one end to a dc voltage source $V_b$ 18 and at the other end to the gate 26, which makes the cover 12 biased when the cover 12 is removed from the box 10. Additional resistor $R_2$ 22, tied at its one end to the dc voltage source $V_b$ 18 and at its other end to the output 20 from the SCR 14, has a predetermined resistance, enough to keep the SCR 14 latched on. $V_b$ 18 is a bias voltage from a low voltage housekeeping supply, not shown.

As soon as the cover 12 is removed from the box 10, the SCR 14 is triggered to electronically sense the removal of the cover 12, because the gate 26 of the SCR 14 is no longer grounded, but is biased via the resistor $R_1$ 16. If the voltage that is impressed on the gate 26 of the SCR 14 is sufficiently large, the SCR 14 is driven into saturation, at which time its junctions are forward-biased and the total voltage drop across the device is very low, thus pulling low the on/off control signal at the output 20 of the SCR 14 for the high voltage electrical system power. The SCR 14 thus instantaneously shuts down and disables the high voltage electrical system connected at the output 20 of the SCR 14, eliminating any possibility of shock hazard from the high voltage electrical system during maintenance work.

This disabling of the high voltage electrical system is accomplished instantaneously when the SCR 14 sends the on/off control signal for the high voltage electrical system power via a control wire, not shown, connected at the output 20 of the SCR 14, which will turn off the high voltage electrical system and discharge any associated high voltage electrical system capacitors. The SCR 14 is reset by turning off the source of bias voltage Vb (which may also be the power source for the high voltage electrical system) and by putting the cover 12 on the box 10.

In the preferred embodiment of the present invention, the connection from the gate 26 of the SCR 14 to the cover 12 is made through mounting screws 24, not shown, that hold the high voltage electrical system onto the cover 12. The power supply for the bias voltage and for the high voltage electrical system, not shown, can also be mechanically mounted to the cover 12, although it can be positioned elsewhere.

The safety discharge circuit for the high voltage electrical system of the present invention can be used with any type of high voltage electrical system, and has both commercial and military applicability. In particular, it can be used in laser rangefinders mounted on personal weapons or vehicles, and in other similar systems.

While this invention has been described with reference to its presently preferred embodiment(s), its scope is only limited insofar as defined by the following set of claims and all equivalents thereof.

What is claimed is:

1. A method of sensing the removal of a cover, releasably connected to a grounded box, and disabling a high voltage electrical system inside said box, comprising the steps of:

electronically sensing the removal of the cover of said grounded box using an electronic means electrically connected to the cover from the grounded box at an input and to the high voltage electrical system at an output, wherein said step of electronically sensing the removal of the cover comprises using a controlled rectifier, wherein said controlled rectifier is in a reverse blocking state when the cover is connected to the box and in a forward conducting state when the cover is removed from the box;

when the removal of the cover is detected, sending a low voltage control signal from the electronic means to the high voltage electrical system, thus turning the high voltage electrical system off and eliminating shock hazards during maintenance of the high voltage electrical system; and latching the low voltage control signal until an associated power supply of the high voltage electrical system is switched off.

2. A safety circuit, capable of protecting a worker from electric shocks during maintenance of high voltage systems, comprising:

a box having a connection to the ground and a cover releasably connected to the box, including a high voltage electrical system inside the box; and an electronic means adapted to sense the removal of said cover from said box and disable the high voltage electrical system, wherein the electronic means are electrically connected to the cover at an input and to the high voltage electrical system at an output, wherein said electronic means comprises a controlled rectifier having a gate at its input, wherein said rectifier is in a reverse blocking state when the cover is connected to the box, and in a forward conducting state when the cover is removed from the box.

3. The circuit according to claim 2, further comprising a resistor tied between a dc voltage source and the gate, wherein the gate of the controlled rectifier is biased with the resistor when the cover is removed from the box.

4. The circuit according to claim 2, further comprising a resistor used to keep the controlled rectifier latched in said forward conducting state.

5. The circuit according to claim 2, wherein said controlled rectifier is a semiconductor controlled rectifier.

6. The circuit according to claim 2, wherein the high voltage electrical system is mechanically connected to an underside of said cover and the electrical connection from the gate of the controlled rectifier to the cover is made through mounting screws holding said high voltage electrical system connected to the cover.

* * * * *